United States Patent
Park et al.

(10) Patent No.: US 11,362,690 B2
(45) Date of Patent: Jun. 14, 2022

(54) APPARATUS AND METHOD FOR AMPLIFYING TRANSMISSION SIGNALS IN WIRELESS COMMUNICATION SYSTEM

(71) Applicant: Samsung Electronics Co., Ltd., Suwon-si (KR)

(72) Inventors: Byungjoon Park, Suwon-si (KR); Daehyun Kang, Suwon-si (KR); Jihoon Kim, Suwon-si (KR); Hyunchul Park, Suwon-si (KR); Juho Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/262,961

(22) PCT Filed: Jul. 25, 2019

(86) PCT No.: PCT/KR2019/009282
§ 371 (c)(1),
(2) Date: Jan. 25, 2021

(87) PCT Pub. No.: WO2020/022817
PCT Pub. Date: Jan. 30, 2020

(65) Prior Publication Data
US 2021/0273665 A1    Sep. 2, 2021

(30) Foreign Application Priority Data

Jul. 26, 2018    (KR) .......................... 10-2018-0087177

(51) Int. Cl.
*H04B 1/04*       (2006.01)
*H03F 3/24*       (2006.01)
(Continued)

(52) U.S. Cl.
CPC ............... *H04B 1/04* (2013.01); *H03F 3/245* (2013.01); *H03F 2200/168* (2013.01); *H03F 2200/451* (2013.01); *H04B 2001/045* (2013.01)

(58) Field of Classification Search
None
See application file for complete search history.

(56) References Cited

U.S. PATENT DOCUMENTS 9,419,692 B2 *  8/2016  Sorrells ................ H04B 7/0621
9,614,477 B1    4/2017  Rozenblit et al.
(Continued)

FOREIGN PATENT DOCUMENTS

GB         2495493 A      4/2013
KR    10-2011-0037732 A   4/2011
(Continued)

OTHER PUBLICATIONS

Extended European Search Report dated Jul. 12, 2021, issued in European Patent Application No. 19841535.8.

*Primary Examiner* — Pablo N Tran
(74) *Attorney, Agent, or Firm* — Jefferson IP Law, LLP (57) ABSTRACT

The present disclosure relates to a 5th generation (5G) or pre-5G communication system for supporting a data transmission rate higher than that of a 4th generation (4G) communication system such as long term evolution (LTE). The present disclosure is to amplify transmission signals in a wireless communication system, and a transmitting device may include an antenna array including a plurality of antenna elements, a plurality of amplification chains for amplifying signals transmitted through the plurality of the antenna elements, and a power supply line for supplying powers to the plurality of the amplification chains. Herein, the powers used by power amplifiers included in at least one amplification chain of the plurality of the amplification (Continued)

chains may be divided by filtering or by independent pads and branch-lines.

7 Claims, 8 Drawing Sheets

(51) Int. Cl.
  *H03F 1/02* (2006.01)
  *H03F 3/19* (2006.01)

(56) References Cited

U.S. PATENT DOCUMENTS

| | | | |
|---|---|---|---|
| 10,491,443 B1* | 11/2019 | Khan | H04B 1/04 |
| 10,511,271 B2 | 12/2019 | Kim et al. | |
| 2003/0227330 A1 | 12/2003 | Khanifar et al. | |
| 2003/0231054 A1 | 12/2003 | Magoon et al. | |
| 2011/0057730 A1 | 3/2011 | Makioka et al. | |
| 2011/0081857 A1 | 4/2011 | Lee et al. | |
| 2012/0038220 A1 | 2/2012 | Kim et al. | |
| 2012/0146731 A1* | 6/2012 | Khesbak | H03F 1/0277 330/295 |
| 2013/0207731 A1* | 8/2013 | Balteanu | H03F 1/56 330/296 |
| 2014/0292599 A1 | 10/2014 | Fifield | |
| 2015/0072671 A1 | 3/2015 | Rofougaran et al. | |
| 2016/0301366 A1 | 10/2016 | Sato et al. | |
| 2020/0204202 A1* | 6/2020 | Lee | H03F 3/211 |
| 2021/0258023 A1* | 8/2021 | Lyn | H04B 1/0067 |
| 2021/0297103 A1* | 9/2021 | Kang | H04B 1/04 |
| 2021/0351517 A1* | 11/2021 | Mishra | H03F 3/245 |

FOREIGN PATENT DOCUMENTS

| | | |
|---|---|---|
| KR | 10-2012-0015921 A | 2/2012 |
| KR | 10-2018-0081317 A | 7/2018 |
| WO | 2018/128420 A1 | 7/2018 |

* cited by examiner

APPARATUS AND METHOD FOR AMPLIFYING TRANSMISSION SIGNALS IN WIRELESS COMMUNICATION SYSTEM

CROSS-REFERENCE TO RELATED APPLICATION(S)

This application is a U.S. National Stage application under 35 U.S.C. § 371 of an International application number PCT/KR2019/009282, filed on Jul. 25, 2019, which is based on and claimed priority of a Korean patent application number 10-2018-0087177, filed on Jul. 26, 2018, in the Korean Intellectual Property Office, the disclosure of which is incorporated by reference herein in its entirety.

TECHNICAL FIELD

The present disclosure generally relates to a wireless communication system, and more particularly, to an apparatus and a method for amplifying transmission signals in the wireless communication system.

BACKGROUND ART

To satisfy a wireless data traffic demand which is growing after a 4th generation (4G) communication system is commercialized, efforts are exerted to develop an advanced 5th generation (5G) communication system or a pre-5G communication system. For this reason, the 5G communication system or the pre-5G communication system is referred to as a beyond 4G network communication system or a post long term evolution (LTE) system.

To achieve a high data rate, the 5G communication system considers its realization in an extremely high frequency (mmWave) band (e.g., 28 GHz or 60 GHz band). To mitigate a path loss of propagation and to extend a propagation distance in the extremely high frequency band, the 5G communication system is discussing beamforming, massive multiple input multiple output (MIMO), full dimensional (FD)-MIMO, array antenna, analog beam-forming, and large scale antenna techniques.

Also, for network enhancement of the system, the 5G communication system is developing techniques such as evolved small cell, advanced small cell, cloud radio access network (RAN), ultra-dense network, device to device (D2D) communication, wireless backhaul, moving network, cooperative communication, coordinated multi-points (CoMP), and receive interference cancellation.

Besides, the 5G system is working on hybrid frequency shift keying and quadrature amplitude modulation (FQAM) and sliding window superposition coding (SWSC) as advanced coding modulation (ACM) schemes, and filter bank multi carrier (FBMC), non orthogonal multiple access (NOMA), and sparse code multiple access (SCMA) as advanced access technologies.

As described above, the 5G system, which uses mmWave band signals, may adopt a technique for securing communication performance in the mmWave band and its corresponding hardware. In particular, a plurality of radio frequency (RF) chains may be used for the beamforming, and in this case, performance degradation may further occur due to interactions between amplifiers for amplifying a signal of each RF chain.

DISCLOSURE OF INVENTION

Technical Problem

Based on the discussions described above, the present disclosure provides an apparatus and a method for efficiently amplifying transmission signals in a wireless communication system.

Also, the present disclosure provides an apparatus and a method for reducing linearity degradation due to a signal having a frequency corresponding to a bandwidth of a signal in a wireless communication system.

Also, the present disclosure provides an apparatus and a method for isolation between a plurality of amplification chains in a wireless communication system.

Also, the present disclosure provides an apparatus and a method for separation between power amplifiers which share a power supply line in a wireless communication system.

Solution to Problem

According to various embodiments of the present disclosure, a transmitting device in a wireless communication system may include an antenna array including a plurality of antenna elements, a plurality of amplification chains for amplifying signals transmitted through the plurality of the antenna elements, and a power supply line for supplying powers to the plurality of the amplification chains. Herein, the powers used by power amplifiers included in at least one amplification chain of the plurality of the amplification chains may be divided by filtering or by independent pads and branch-lines.

According to various embodiments of the present disclosure, an operating method of a transmitting device in a wireless communication system may include supplying power to a plurality of amplification chains through a power supply line, amplifying a signal using the plurality of the amplification chains which operate using the power, and transmitting the signal. Herein, powers used by power amplifiers included in at least one amplification chain of the plurality of the amplification chains may be divided by filtering or by independent pads and branch-lines.

Advantageous Effects of Invention

An apparatus and a method according to various embodiments of the present disclosure, improves linearity of a radio frequency (RF) circuit.

Effects obtainable from the present disclosure are not limited to the above-mentioned effects, and other effects which are not mentioned may be clearly understood by those skilled in the art of the present disclosure through the following descriptions.

BEST MODE FOR CARRYING OUT THE INVENTION

Terms used in the present disclosure are used for describing particular embodiments and are not intended to limit the scope of other embodiments. A singular form may include a plurality of forms unless it is explicitly differently represented. All the terms used herein, including technical and scientific terms, may have the same meanings as terms generally understood by those skilled in the art to which the present disclosure pertains. Among terms used in the present disclosure, the terms defined in a general dictionary may be interpreted to have the same or similar meanings with the context of the relevant art, and, unless explicitly defined in this disclosure, it shall not be interpreted ideally or excessively as formal meanings. In some cases, even terms defined in this disclosure should not be interpreted to exclude the embodiments of the present disclosure.

In various embodiments of the present disclosure to be described below, a hardware approach will be described as an example. However, since the various embodiments of the present disclosure include a technology using both hardware and software, the various embodiments of the present disclosure do not exclude a software-based approach.

Hereafter, the present disclosure relates to an apparatus and a method for amplifying a transmission signal in a wireless communication system. Specifically, the present disclosure describes a technique for reducing adverse effects between amplifiers or amplification chains included in a plurality of radio frequency (RF) chains in a wireless communication system.

Terms indicating signals, terms indicating network entities, and terms indicating components of an apparatus, which are used in the following descriptions, are for the sake of explanations. Accordingly, the present disclosure is not limited to the terms to be described, and may use other terms having technically identical meaning.

Figure 1:
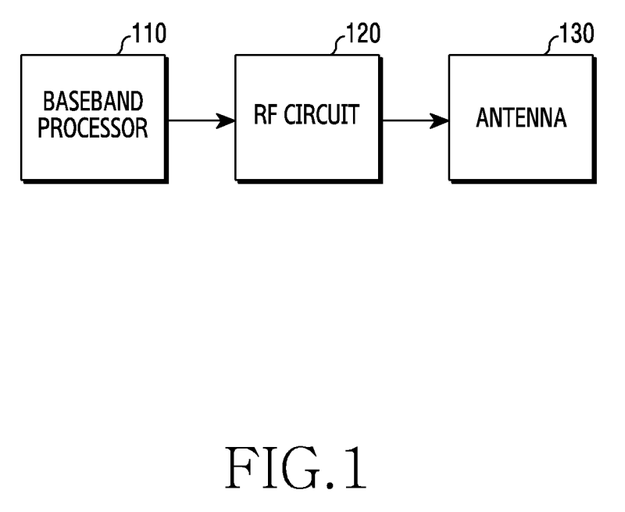
FIG. 1 illustrates a configuration of a transmitting device in a wireless communication system according to various embodiments of the present disclosure.

FIG. 1 illustrates a configuration of a transmitting device in a wireless communication system according to various embodiments of the present disclosure. A term such as 'portion' or '~er' used hereafter indicates a unit for processing at least one function or operation, and may be implemented using hardware, software, or a combination of hardware and software.

Referring to FIG. 1, the transmitting device includes a baseband processor 110, an RF circuit 120, and an antenna 130.

The baseband processor 110 performs a conversion function between a baseband signal and a bit string according to a physical layer standard of the system. For example, in data transmission, the baseband processor 110 generates complex symbols by encoding and modulating a transmission bit string. For example, in conformity with orthogonal frequency division multiplexing (OFDM), the baseband processor 110 generates complex symbols by encoding and modulating a transmission bit stream, maps the complex symbols to subcarriers, and then generates OFDM symbols through inverse fast fourier transform (IFFT) operation and cyclic prefix (CP) insertion. In addition, the baseband processor 110 may output a control signal for controlling operations of the RF circuit 120. For doing so, the baseband processor 110 may include at least one processor (e.g., a digital signal processor (DSP), a microprocessor, a micro control unit, etc.).

The RF circuit 120 performs a function for transmitting a signal over a wireless channel, such as band conversion and amplification of the signal. That is, the RF circuit 120 up-converts the baseband signal provided from the baseband processor 110 to an RF band signal and then provides the RF band signal to the antenna 130. For example, the RF circuit 120 may include a transmission filter, an amplifier, a mixer, an oscillator, a digital to analog convertor (DAC), and so on. In addition, the RF circuit 120 may include a plurality of RF chains. In addition, the RF circuit 120 may perform beamforming. For the beamforming, the RF circuit 120 may include phase shifters for adjusting phase and amplitude of each of the signals transmitted and received through a plurality of antenna elements included in the antenna 130.

The antenna 130 radiates the RF band signals provided from the RF circuit 120 over the wireless channel. The antenna 130 is configured in the form of an array, and may include a plurality of antenna elements.

The transmitting device shown in FIG. 1 transmits the signal as described above. Additionally, the components of the transmitting device in FIG. 1 may be used to receive a signal. In this case, the RF circuit 120 may perform reception filtering, gain control, amplification, down conversion, and digital conversion on the signal received via the antenna 130, and the baseband processing unit 110 may perform demodulation and decoding. Accordingly, the baseband processor 110 and the RF circuit 120 may be referred to as a transmitter, a receiver, a transceiver or a communicator.

In the wireless communication system according to various embodiments, the configuration of the transmitting device illustrated in FIG. 1 may be included in various devices. For example, the transmitting device illustrated in FIG. 1 may be part of a base station or a terminal. Herein, the base station is a network infrastructure which provides wireless access to terminals, and may be referred to as, besides the base station, an 'access point (AP)', an eNodeB (eNB)', a '5th generation node (5G node)', a next generation nodeB (gNB), a 'wireless point', a 'transmission/reception point (TRP)', or other terms having technically identical meaning. The terminal is a device used by a user, and communicates with the base station over a radio channel, or operates without user's involvement, for example, performs machine type communication (MTC), and may be referred to as, besides the terminal, a 'user equipment (UE)', a 'mobile station', a 'subscriber station', a 'remote terminal', a 'wireless terminal', or a 'user device', or other term having a technically equivalent meaning.

As described with reference to FIG. 1, the antenna 130 may include a plurality of antenna elements. In this case, the transmission signal provided to each antenna element may be amplified through a separate amplification chain. That is, there may be as many amplification chains as the antenna elements. In addition, for massive data transmission, a channel bandwidth used may be several GHz. For doing so, it is required to implement a power amplifier having a wide bandwidth, high power, and high linearity.

In this environment, if a general power amplifier structure is used, linearity may be degraded, in applying a broadband 1 GHz bandwidth signal. Specifically, if the signal bandwidth is widened to about 1 GHz and a phased-array based on a plurality of power amplifiers is used, an envelope signal having a frequency corresponding to the bandwidth of the signal may be generated in a power supply circuit shared among the plurality of the power amplifiers and impedance may increase at the frequency of the envelope signal. That is, in the implementation of the phased-array transmission, due to a parasitic component of direct current (DC) power, the impedance may increase at the frequency of the envelope signal. In other words, in a multi-stage power amplifier, a nonlinear component of the final power amplifier may flow into the shared DC power supply line, thus degrading the overall linearity.

One of the causes of the performance degradation of the power amplifier is a memory effect. Factors affecting the memory effect include third-order transconductance (Gm3), second harmonic impedance, and envelope impedance. The third-order transconductance may be reduced by a class AB bias in a peak power region. The secondary harmonic impedance may be reduced by a second short circuit integrated on the power amplifier.

The memory effect is related to third-order intermodulation distortion (IMD3). Intermodulation distortion is caused by an output frequency component combined with sum and difference of harmonic frequencies of signals having different frequencies, and is a distortion factor which interferes with original signals such as noise. The third-order intermodulation distortion occurs in processing two or more signals of different frequencies in a nonlinear system, which is illustrated in the form of a vector in FIG. 2.

Figure 2:
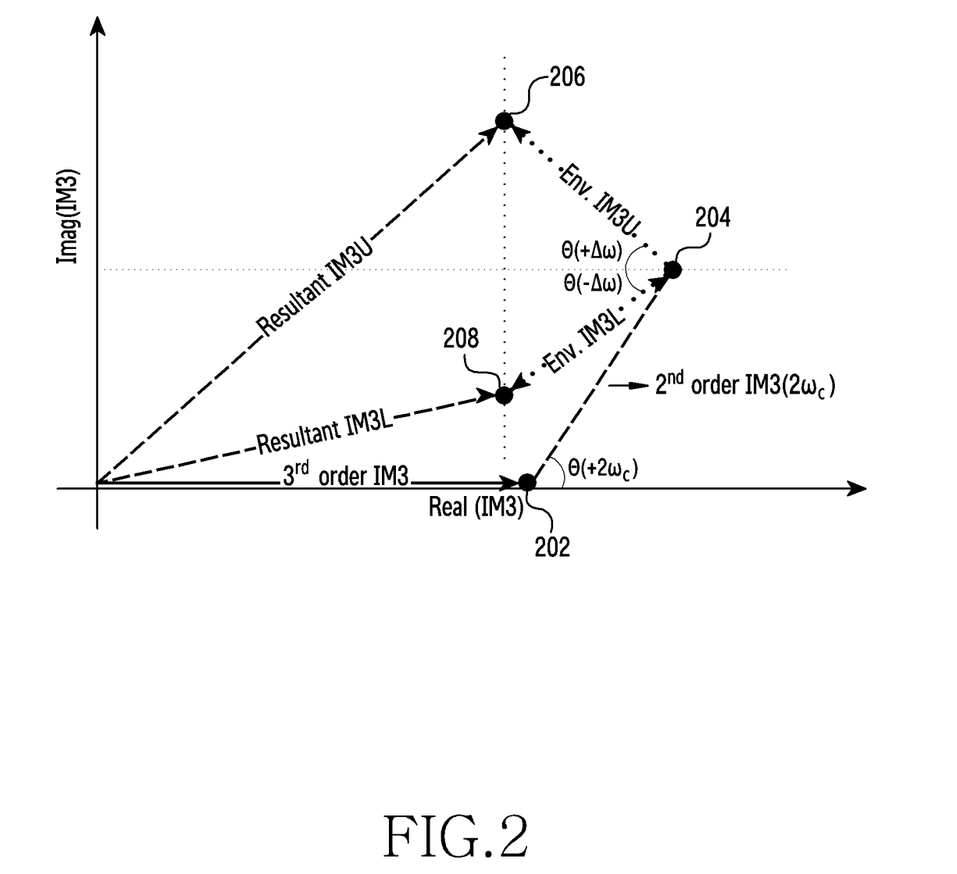
FIG. 2 illustrates a composition of third-order intermodulation distortion (IMD3) in a wireless communication system according to various embodiments of the present disclosure.

FIG. 2 illustrates a composition of third-order intermodulation distortion in a wireless communication system according to various embodiments of the present disclosure. Referring to FIG. 2, the third-order IM3 composition has a value of $[A_{3rd}, 0*j]$ 202. By the 2nd order IM3 composition, the value becomes $[A_{3rd}+A_{2nd}, B_{2nd}*j]$ 204. Finally, by an envelope frequency signal, the upper IM3 composition having a value $[A_{3rd}+A_{2nd}+A_{env}, (B_{2nd}+B_{env})*j]$ 206 and the lower IM3 composition a value $[A_{3rd}+A_{2nd}+A_{env}, (B_{2nd}-B_{env})*j]$ 208 are generated. The upper IM3 composition and the lower IM3 composition are expressed as the following Equation 1 and Equation 2 below.

$$V_{d3}(2w_2 - w_1) = v_g^3 Z_L(w_c) \qquad \text{Equation 1}$$
$$\left[\frac{1}{2}G_{m2}G_{md}Z_L(w_2 - w_1) + \frac{1}{4}G_{m2}G_{md}Z_L(2w_c) + \frac{3}{4}G_{m3}\right]$$

In Equation 1, $V_{d3}(2w_2-w_1)$ denotes an upper intermodulation drain voltage of the third-order intermodulation distortion composition, $w_1$ denotes the lowest frequency of the bandwidth of the transmission signal, $w_2$ denotes the highest frequency of the bandwidth of the transmission signal, $w_c$ denotes a carrier frequency of the transmitted signal, $v_g^3$ denotes two-tone excitation with the lower and upper tones at $w_1$ and $w_2$, respectively, $Z_L$ denotes the impedance by the envelope frequency, $G_{m2}$ denotes the 2nd order transconductance variation with gate-source voltage, and $G_{md}$ denotes first order nonlinear dependence of Gds (output conductance) on gate-source voltage, and $G_{m3}$ denotes the 3rd order transconductance variation with gate-source voltage.

$$V_{d3}(2w_1 - w_2) = v_g^3 Z_L(w_c) \qquad \text{Equation 2}$$
$$\left[\frac{1}{2}G_{m2}G_{md}Z_L(w_1 - w_2) + \frac{1}{4}G_{m2}G_{md}Z_L(2w_c) + \frac{3}{4}G_{m3}\right]$$

In Equation 2, $V_{d3}(2w_1-w_2)$ denotes the lower intermodulation drain voltage of the third-order intermodulation distortion composition, $w_1$ denotes the lowest frequency of the bandwidth of the transmission signal, $w_2$ denotes the highest frequency of the bandwidth of the transmission signal, $w_c$ denotes the carrier frequency of the transmitted signal, $v_g^3$ denotes the two-tone excitation with the lower and upper tones at $w_1$ and $w_2$, respectively, $Z_L$ denotes the impedance by the envelope frequency, $G_{m2}$ denotes the 2nd order transconductance variation with gate-source voltage, and $G_{md}$ denotes the first order nonlinear dependence of Gds (output conductance) on gate-source voltage, and $G_{m3}$ denotes the 3rd order transconductance variation with gate-source voltage.

In Equation 1 and Equation 2, $Z_L(w_1-w_2)$ and $Z_L(w_2-w_1)$ denote the envelope impedance, that is, the impedance generated by the envelope signal having the frequency corresponding to the bandwidth of the transmission signal. At this time, the two third-order intermodulation compositions have asymmetric values as shown in FIG. 3.

Figure 3:
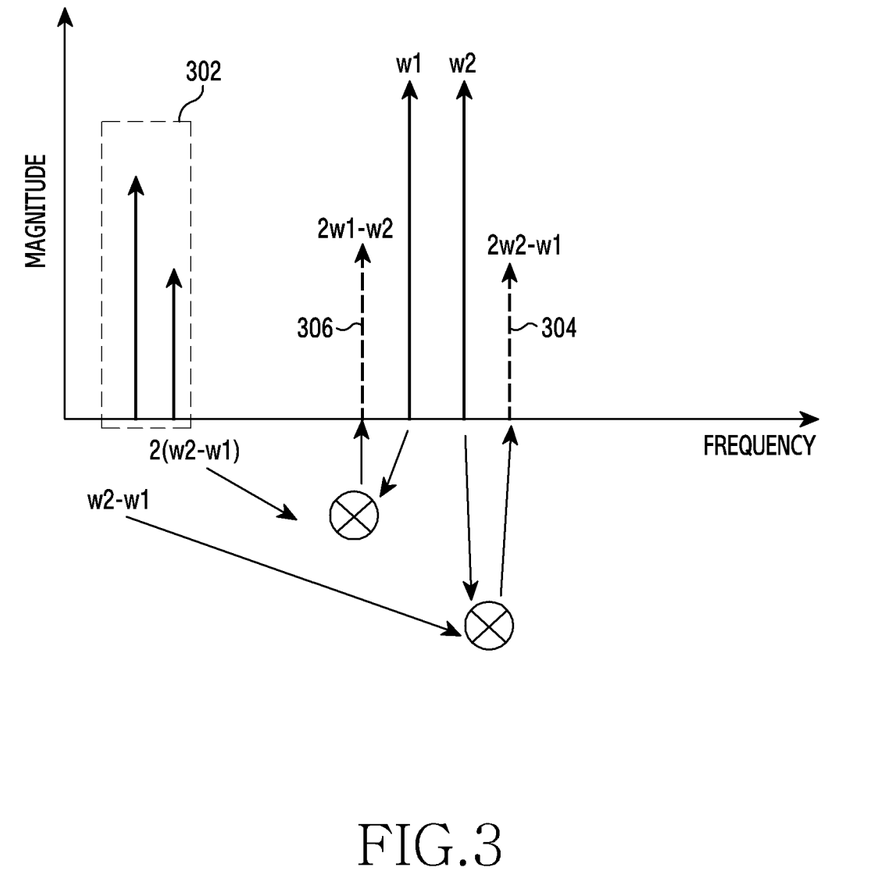
FIG. 3 illustrates an asymmetry phenomenon of third-order intermodulation distortion in a wireless communication system according to various embodiments of the present disclosure.

FIG. 3 illustrates an asymmetry phenomenon of third-order intermodulation distortion in a wireless communication system according to various embodiments of the present disclosure. Referring to FIG. 3, $w_1$ denotes the lowest frequency of the bandwidth of the transmission signal, and $w_2$ denotes the highest frequency of the bandwidth of the transmission signal. If signals having frequencies of $w_1$ and $w_2$ are inputted, envelope signals 302 having a frequency corresponding to a frequency interval of the two signals are generated. In addition, third-order intermodulation compositions 304 and 306 are generated, and magnitudes of the lower third-order intermodulation composition 306 and the upper third-order intermodulation composition 304 are different from each other by the envelope signals 302.

Referring to Equation 1 and Equation 2, the envelope impedance contributes to the magnitude of the third-order intermodulation composition more than other compositions (e.g., $Z_L(2w_2)$, etc.), reducing the envelope impedance may significantly affect suppression of the third-order intermodulation composition. Hence, the present disclosure now describes various embodiments for reducing the influence of the envelope signal.

Figure 4:
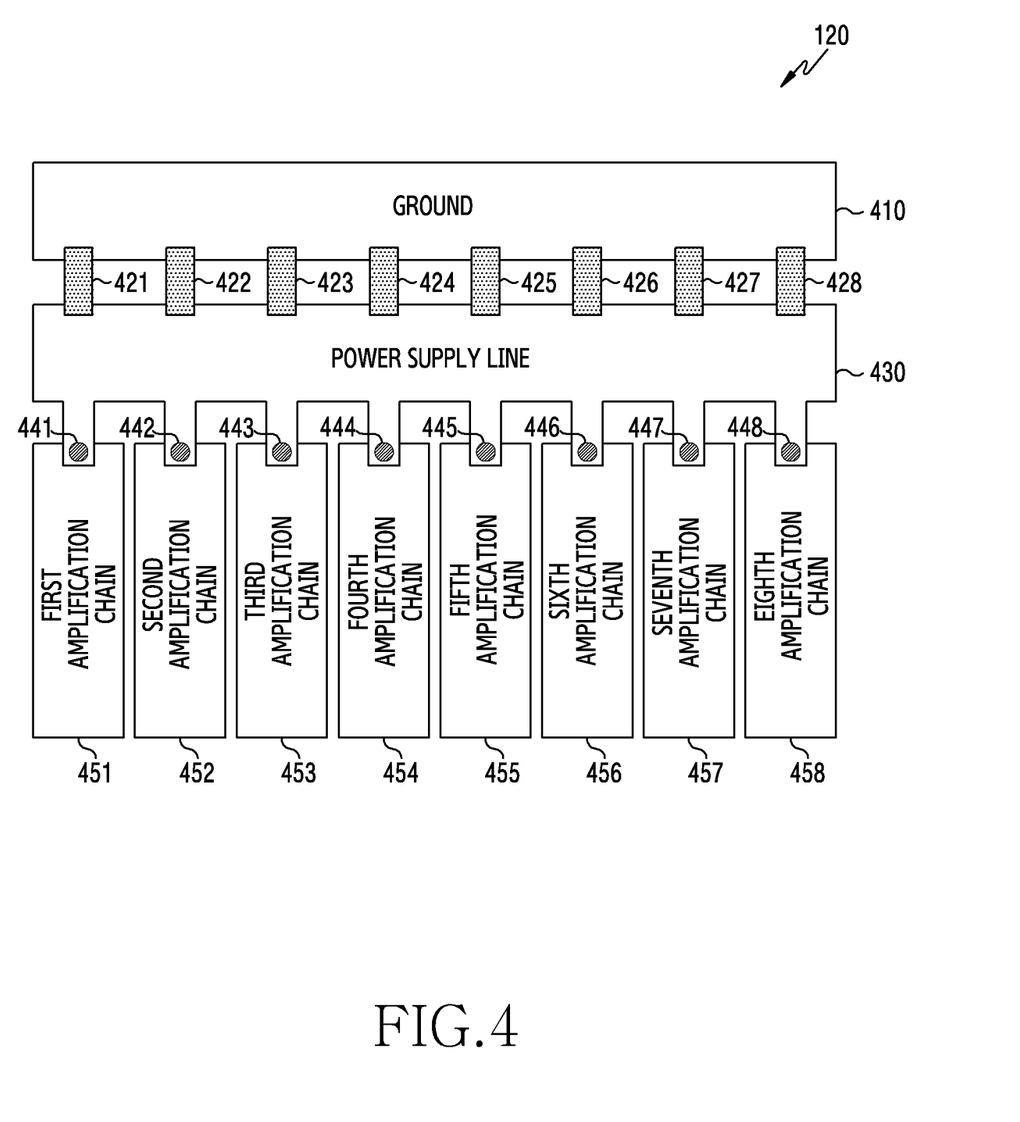
FIG. 4 illustrates a configuration of a radio frequency (RF) circuit of a transmitting device in a wireless communication system according to various embodiments of the present disclosure.

FIG. 4 illustrates a configuration of an RF circuit of a transmitting device in a wireless communication system according to various embodiments of the present disclosure. FIG. 4 illustrates a configuration of the RF circuit 120.

Referring to FIG. 4, the RF circuit includes an AC ground 410, a plurality of contact units 421 through 428, a power supply line 430, a plurality of pads 441 through 448, and a plurality of amplification chains 451 through 458.

The AC ground 410 is a component which provides a voltage reference point. According to one embodiment, the AC ground 410 may be configured as part of the RF circuit to provide the voltage reference point. According to another embodiment, the AC ground 410 may be configured not to be included in the RF circuit. For example, part of a housing of the transmitting device or a package of the RF circuit may function as the AC ground 410.

The plurality of the contact units 421 through 428 emit a signal of a predefined frequency band to the AC ground 410. That is, the plurality of the contact units 421 through 428

AC-grounds the power supply line 430 in a predefined frequency band. Each of the plurality of the contact units 421 through 428 emits the signal of the predefined frequency band flowing into the power supply line 430 at each of the pads 441 through 448 to the AC ground 410, and thus isolate powers of the amplification chains 451 through 458 for the predefined frequency band. Thus, the isolation per chain may be enabled in the RF circuit including the multiple chains. For example, the predefined frequency band may be a frequency band below the envelope frequency of the transmission signal. In other words, a specific frequency band may include a frequency range below the bandwidth of the transmission signal.

For doing so, the plurality of the contact units 421 through 428 each may include at least one capacitor, and capacitance of the capacitor may be selected to have a self resonance frequency (SRF) smaller than the bandwidth of the transmission signal. If the plurality of the contact units 421 through 428 each includes two or more capacitors, the two or more capacitors may be connected in parallel. For example, if the envelope frequency is 1 GHz, two capacitors having 100 nF and 1 µF values may be used.

The power supply line 430 is a line for supplying the power for the operation of the plurality of the amplification chains 451 through 458. According to an embodiment, the power supply line 430 may be designed to have a predetermined width. Herein, the width may be selected to an appropriate value to adjust the impedance of the power supply line 430. The plurality of the pads 441 through 448 are components for interconnecting the power supply line 430 and the plurality of the amplification chains 451 through 458, and are disposed on lines branched from the power supply line 430. The plurality of the pads 441 through 448 each may be referred to as a 'ball'.

The plurality of the amplification chains 451 through 458 correspond to the plurality of the RF chains, and amplifies the processed signals through the RF chains. Each of the plurality of the amplification chains 451 through 458 may include one amplifier, or may include two or more amplifiers connected in series.

In the structure of the RF circuit explained with reference to FIG. 4, the eight contact units 421 through 428 are included. The number of the contact units 421 through 428 is equal to the number of the branch-lines formed at the power supply line 430 toward the plurality of the amplification chains 451 through 458. That is, the number of the contact units 421 through 428 is equal to the number of the branch-lines. However, according to another embodiment, the plurality of the amplification chains 451 through 458 may be grouped, and amplification chains belonging to one group may share one branch-line. In this case, unlike in FIG. 4, the number of the contact units 421 through 428 may be different from the number of the branch-lines. For example, two amplification chains may share one branch-line, and contact units as many as half the number of the amplification chains may be formed. In this case, two pads may be disposed in one branch-line.

As explained with reference to FIG. 4, the signals of the envelope frequency discharging from the plurality of the amplification chains 451 through 458 through the plurality of the contact units 421 through 428 are connected to the AC ground 410. Thus, the phenomenon that the signals of the envelope frequency are moved between the plurality of the amplification chains 451 through 458 through the power supply line 430 may be prevented. In other words, thanks to the plurality of the contact units 421 through 428, the phenomenon that the signal of the envelope frequency generated in one amplification chain flows into other amplification chain through the power supply line may be prevented, and linearity of the entire RF circuit may be improved.

In the embodiment described with reference to FIG. 4, the plurality of the contact units 421 through 428 guide the signals of the envelope frequency flowing from the plurality of the amplification chains 451 through 458 via the plurality of the pads 441 through 448 to be outputted to the AC ground 410. For example, the signal flowing through the pad 441 may be outputted to the AC ground 410 by the contact unit 421. At this time, the smaller impedance of the path between the pad 441 and the contact unit 421 may effectively block the signal of the envelope frequency. To this end, it is advantageous to dispose the capacitor included in each of the plurality of the contact units 421 through 428 as close to each of the plurality of the pads 441 through 448 as possible. Hence, in designing the RF circuit, shortening the distance between the capacitor included in each of the plurality of the contact units 421 through 428 and each of the plurality of the pads 441 through 448 may be considered first.

In addition, according to various embodiments, if a plurality of amplifiers is included in one amplification chain, a structure for separating the powers among the plurality of the amplifiers may be used. In this case, the structure for the separation between the powers of the amplifiers in the individual amplification chain may be applied together with the above-described structure for the isolation between the power modules, or without the structure for the isolation between the power modules. Embodiments for the separation between the powers of the amplifiers are shown in FIG. 5A or FIG. 5B.

Figure 5A:
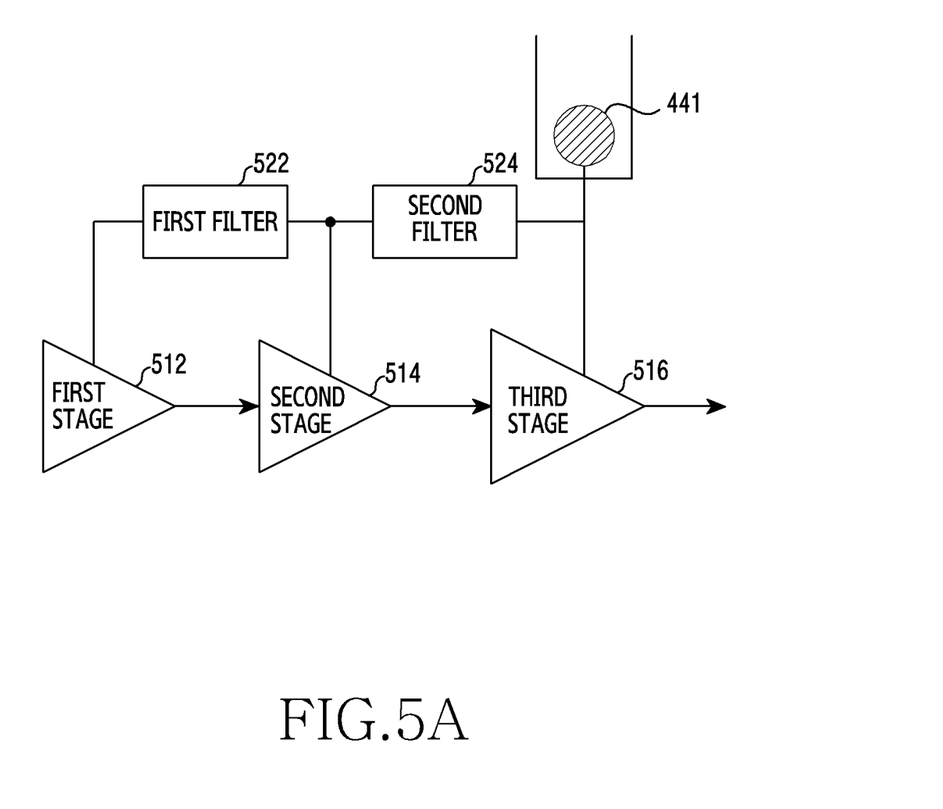
FIG. 5A illustrates a configuration of an amplification chain in an RF circuit of a transmitting device in a wireless communication system according to various embodiments of the present disclosure.
Figure 5B:
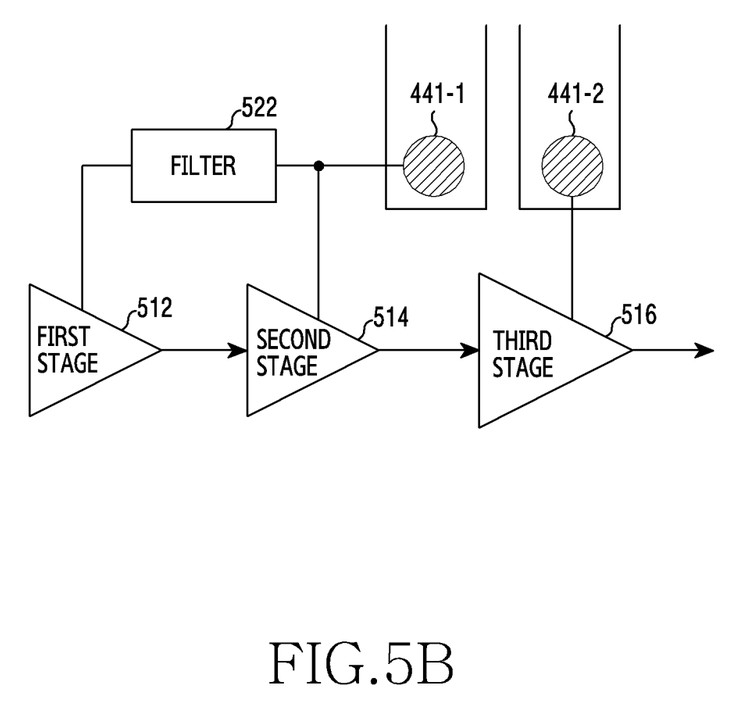
FIG. 5B illustrates another configuration of the amplification chain in the RF circuit of the transmitting device in the wireless communication system according to various embodiments of the present disclosure.

FIG. 5A illustrates a configuration of an amplification chain in an RF circuit of a transmitting device in a wireless communication system according to various embodiments of the present disclosure. FIG. 5 illustrates the configuration of one (e.g., the first amplification chain 451) of the amplification chains included in the RF circuit 120.

Referring to FIG. 5A, the amplification chain includes a first stage power amplifier (PA) 512, a second stage PA 514, a third stage PA 516, a first filter 522, and a second filter 524.

The first stage PA 512, the second stage PA 514, and the third stage PA 516 sequentially amplify a transmission signal. The first stage PA 512, the second stage PA 514, and the third stage PA 516 have different gains, and for so doing, may be implemented with transistors of different sizes or numbers. For example, the third stage PA 516 may have greater output than the second stage PA 514, and the second stage PA 514 may have greater output than the first stage PA 512.

The first stage PA 512, the second stage PA 514, and the third stage PA 516 receive power through the pad 441. That is, power lines of the first stage PA 512, the second stage PA 514, and the third stage PA 516 are electrically connected. Accordingly, the signal of the envelope frequency generated at the third stage PA 516 may flow into power units of the second stage PA 514 and the third stage PA 516 through the power lines. Thus, to prevent the inflow of the signal of the envelope frequency, the first filter 522 and the second filter 524 may be disposed.

The first filter 522 and the second filter 524 each blocks signals below the envelope frequency. The first filter 522 is disposed between the power line of the first stage PA 512 and the power line of the second stage PA 514, and blocks a signal of a predefined frequency band, that is, the signal of the envelope frequency. The second filter 524 is disposed between the power line of the second stage PA 514 and the power line of the third stage PA 516, and blocks a signal of a predefined frequency band, that is, the signal of the envelope frequency. That is, the first filter 522 and the second filter 524 each forms impedance close to open or the AC ground at the envelope frequency. In other words, the first filter 522 and the second filter 524 each blocks the envelope frequency between the power amplifiers 512, 514, and 516. For doing so, the first filter 522 and the second filter 524 each blocks each other such as open by exhibiting great impedance, or eliminate the signal of the envelope frequency by AC-grounding at the envelope frequency band. To this end, the first filter 522 and the second filter 524 each may be implemented with at least one inductor or at least one capacitor having a value corresponding to the envelope frequency. For example, the first filter 522 may include at least one inductor connected between both ends of the first filter 522, at least one capacitor connected between one end and the ground, and at least one other capacitor connected between the other end and the ground. As another example, the first filter 522 may include at least one inductor connected between both ends of the first filter 522.

FIG. 5B illustrates another configuration of the amplification chain in the RF circuit of the transmitting device in the wireless communication system according to various embodiments of the present disclosure. FIG. 5 illustrates the configuration of one (e.g., the first amplification chain 451) of the amplification chains included in the RF circuit 120.

Referring to FIG. 5B, the amplification chain includes the first stage PA 512, the second stage PA 514, the third stage PA 516 and the filter 522. In FIG. 5B, unlike the FIG. 5A, a pad 441-1 which supplies the power to the first stage PA 512 and the second stage PA 514 and a pad 441-2 which supplies the power to the third stage PA 516 are separated, and substrate on which the pad 441-1 and the pad 441-2 are disposed and lines connected to the pad 441-1 and the pad 441-2 are also separately formed. That is, the third stage PA 516 having the greatest output receives the power through the pad 441-2 independent of the pad 441-1 for supplying the power to the other power amplifiers. The power of the power amplifiers sharing the pads 441-1 is divided at the envelope frequency through the filter 522.

In the embodiment described with reference to FIG. 5B, the pad for one power amplifier (e.g., the third stage PA 516) is designed independently, and the remaining power amplifiers (e.g., the first stage PA 512, the second stage 514) still share one pad. However, according to another embodiment, independent pads for all power amplifiers may be disposed. That is, there may be as many pads and lines as the power amplifiers.

Figure 6:
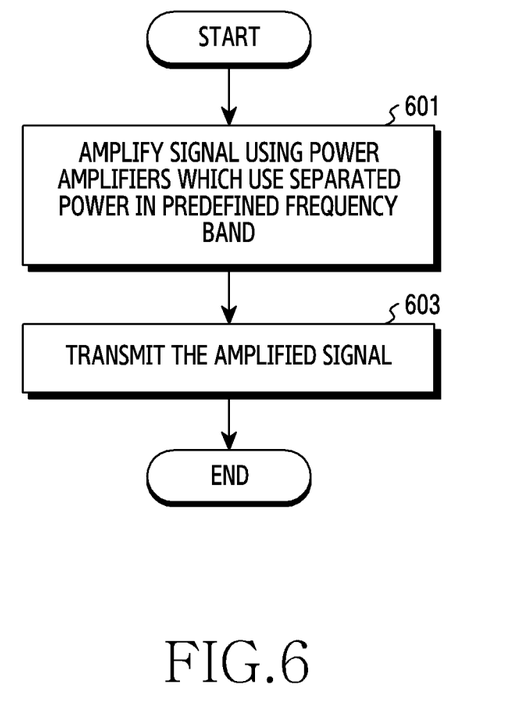
FIG. 6 illustrates a flowchart for signal transmission of a transmitting device using separate power for each amplification chain in a wireless communication system according to various embodiments of the present disclosure.

FIG. 6 illustrates a flowchart for signal transmission of a transmitting device using separate power for each amplification chain in a wireless communication system according to various embodiments of the present disclosure. FIG. 6 illustrates an operating method of the transmitting device of FIG. 1.

Referring to FIG. 6, in step 601, the transmitting device amplifies a signal using power amplifiers which use separated powers in a predefined frequency band. Herein, the powers for the power amplifiers may be separated by filtering, or by independent pads and lines. For example, the transmitting device may supply the power to the power amplifiers through one connected path, but may separate the power using at least one filter which blocks a signal of a predefined frequency band. Alternatively, the transmitting device may separate the power, by independently operating a pad and a line for connecting the power supply line and the power amplifier with respect to the at least one power amplifier.

In operation 603, the transmitting device transmits the amplified signal. The transmitting device may include an antenna array including a plurality of antenna elements. In this case, the transmitting device may amplify each of a plurality of signals, and transmit the amplified signals through the plurality of the antenna elements. Additionally, the transmitting device may perform transmit beamforming, by adjusting a phase of at least some of the signals before or after the amplification operation.

Figure 7:
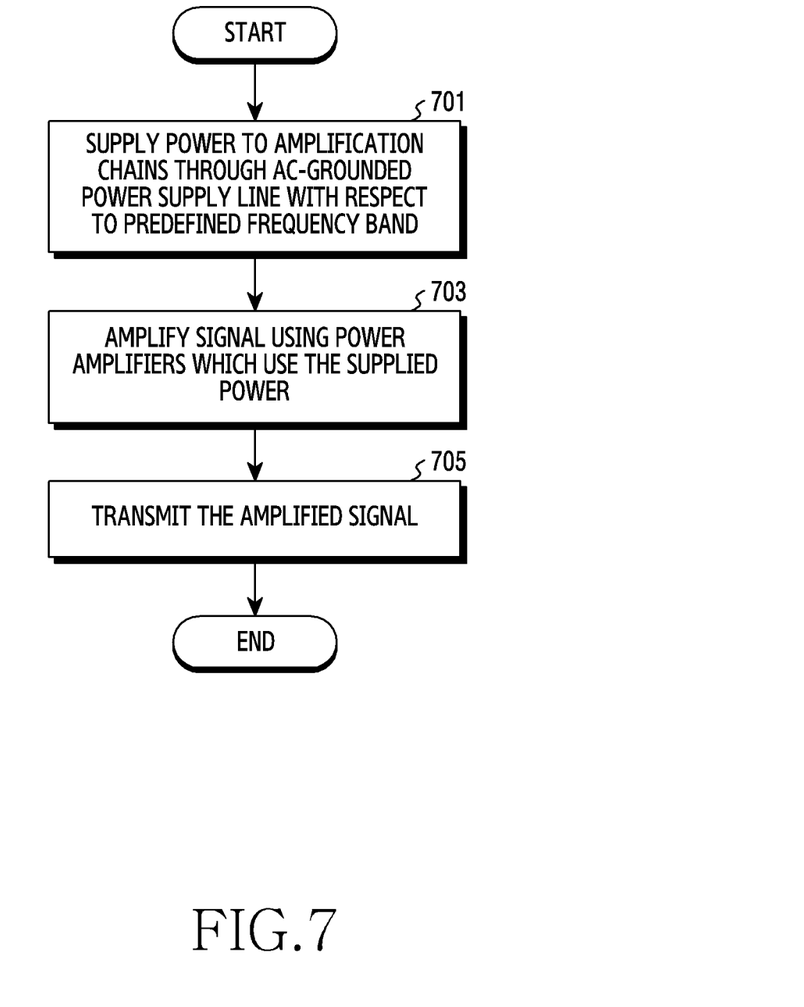
FIG. 7 illustrates a flowchart for signal transmission of a transmitting device using an alternating current (AC) grounded power supply line in a wireless communication system according to various embodiments of the present disclosure.

FIG. 7 illustrates a flowchart for signal transmission of a transmitting device using an alternating current (AC) grounded power supply line in a wireless communication system according to various embodiments of the present disclosure. FIG. 7 illustrates an operating method of the transmitting device of FIG. 1.

Referring to FIG. 7, in step 701, the transmitting device supplies power to amplification chains through an AC-grounded power supply line with respect to a predefined frequency band. That is, the transmitting device supplies the power to the amplification chains through a circuit designed to provide isolated power for a predefined frequency band. Herein, the predefined frequency band may be a bandwidth of the transmission signal, that is, a frequency band below the envelope frequency.

In step 703, the transmitting device amplifies the signal using power amplifiers which use the supplied power. In operation 705, the transmitting device transmits the amplified signal. The transmitting device may include an antenna array including a plurality of antenna elements. In this case, the transmitting device may amplify each of a plurality of signals, and transmit the amplified signals through the plurality of the antenna elements. Additionally, the transmitting device may perform transmit beamforming, by adjusting a phase of at least some of the signals before or after the amplification operation.

The methods according to the embodiments described in the claims or the specification of the present disclosure may be implemented in software, hardware, or a combination of hardware and software.

As for the software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods according to the embodiments described in the claims or the specification of the present disclosure.

Such a program (software module, software) may be stored to a random access memory, a non-volatile memory including a flash memory, a read only memory (ROM), an electrically erasable programmable ROM (EEPROM), a magnetic disc storage device, a compact disc (CD)-ROM, digital versatile discs (DVDs) or other optical storage devices, and a magnetic cassette. Alternatively, it may be stored to a memory combining part or all of those recording media. A plurality of memories may be included.

Also, the program may be stored in an attachable storage device accessible via a communication network such as Internet, Intranet, local area network (LAN), wide LAN (WLAN), or storage area network (SAN), or a communication network by combining these networks. Such a storage device may access a device which executes an embodiment of the present disclosure through an external port. In addition, a separate storage device on the communication network may access the device which executes an embodiment of the present disclosure.

In the specific embodiments of the present disclosure, the elements included in the present disclosure are expressed in a singular or plural form. However, the singular or plural expression is appropriately selected according to a proposed situation for the convenience of explanation, the present disclosure is not limited to a single element or a plurality of elements, the elements expressed in the plural form may be configured as a single element, and the elements expressed in the singular form may be configured as a plurality of elements.

Meanwhile, while the specific embodiment has been described in the explanations of the present disclosure, it will be noted that various changes may be made therein without departing from the scope of the present disclosure. Thus, the scope of the present disclosure is not limited and defined by the described embodiment and is defined not only the scope of the claims as below but also their equivalents.

The invention claimed is:

1. A transmitting device in a wireless communication system, the transmitting device comprising:
   an antenna array comprising a plurality of antenna elements;
   a plurality of amplification chains, wherein each amplification chain of the plurality of the amplification chains includes a first-stage power amplifier (PA), a second-stage PA and a third-stage PA;
   a power supply line for supplying powers to the plurality of the amplification chains;
   an alternating current (AC) ground; and
   a plurality of contact units disposed between the AC ground and the power supply line,
   wherein the power supply line is divided into branch-lines corresponding to the plurality of amplification chains,
   wherein a first pad connected to the first-stage PA and the second-stage PA and a second pad connected to the third-stage PA are disposed on each of the branched-lines, and
   wherein a filter is disposed between a power line of the first-stage PA and a power line of the second-stage PA.

2. The transmitting device of claim 1,
   wherein each of the plurality of contact units comprises at least one capacitor disposed between the power supply line and a ground, and
   wherein the at least one capacitor has a smaller self resonance frequency (SRF) than a bandwidth of signals.

3. The transmitting device of claim 1, wherein the filter comprises at least one inductor connected between one end and the other end of the filter, at least one capacitor connected between the one end and a ground, and at least one other capacitor connected between the other end and the ground.

4. The transmitting device of claim 1, wherein the filter comprises at least one inductor connected between one end and the other end of the filter.

5. The transmitting device of claim 1,
   wherein a gain of the first-stage PA is smaller than a gain of the second-stage PA, and
   wherein the gain of the second-stage PA is smaller than a gain of the third-stage PA.

6. The transmitting device of claim 1, wherein the first-stage PA, the second-stage PA, and the third-stage PA sequentially amplify a signal.

7. The transmitting device of claim 1, wherein one of the branched-lines corresponds to the one of the plurality of amplification chains.

* * * * *